(12) United States Patent
Lee et al.

(10) Patent No.: US 12,387,659 B2
(45) Date of Patent: Aug. 12, 2025

(54) DISPLAY DEVICE

(71) Applicant: Samsung Display Co., Ltd., Yongin-Si (KR)

(72) Inventors: Jang-Mi Lee, Hwaseong-si (KR); Eunjin Choi, Yongin-si (KR); Kihyun Pyun, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/098,695

(22) Filed: Jan. 19, 2023

(65) Prior Publication Data
US 2023/0298528 A1    Sep. 21, 2023

(30) Foreign Application Priority Data
Mar. 17, 2022  (KR) .................. 10-2022-0033224

(51) Int. Cl.
| | |
|---|---|
| G09G 3/32 | (2016.01) |
| G01R 19/165 | (2006.01) |
| G09G 3/00 | (2006.01) |
| G09G 3/3258 | (2016.01) |

(52) U.S. Cl.
CPC ............. G09G 3/32 (2013.01); G01R 19/165 (2013.01); G09G 3/006 (2013.01); G09G 3/3258 (2013.01); G09G 2330/00 (2013.01); G09G 2330/04 (2013.01); G09G 2330/08 (2013.01)

(58) Field of Classification Search
CPC ........ G09G 3/006; G09G 3/32; G09G 3/3258; G09G 2330/00; G09G 2330/04; G09G 2330/08; G01R 19/165

USPC ......................................................... 345/204
See application file for complete search history.

(56) References Cited

U.S. PATENT DOCUMENTS

| | | | |
|---|---|---|---|
| 9,722,410 B2 | 8/2017 | Kim | |
| 9,728,118 B2 | 8/2017 | Park | |
| 10,741,117 B2 | 8/2020 | Park | |
| 11,250,774 B2* | 2/2022 | Kang | .................. G09G 3/3225 |
| 11,289,018 B2* | 3/2022 | Kim | ..................... G09G 3/3275 |

(Continued)

FOREIGN PATENT DOCUMENTS

| | | |
|---|---|---|
| KR | 10-0374603 B1 | 3/2003 |
| KR | 10-2018-0094206 A | 8/2018 |

(Continued)

*Primary Examiner* — Jason M Mandeville
(74) *Attorney, Agent, or Firm* — Innovation Counsel LLP

(57) ABSTRACT

Disclosed is a display device including a display panel, a voltage generator, a current detector, and a current controller. The display panel includes a pixel for receiving a driving voltage. The voltage generator generates the driving voltage, determines a voltage level of the driving voltage based on a voltage control signal, and performs a protection operation in response to a protection signal. The current detector detects a driving current of the display panel and outputs a current signal corresponding to the detected driving current. The current controller includes a current comparison unit that generates a result signal by comparing a present current level of the current signal from the current detector to a previous current level and a protection operating unit that receives the result signal and outputs the protection signal based on a change in the load and a difference between the target current and the current signal.

14 Claims, 10 Drawing Sheets

(56) References Cited

U.S. PATENT DOCUMENTS

| | | | | |
|---|---|---|---|---|
| 2015/0371601 | A1* | 12/2015 | Kim | G06F 1/28 |
| | | | | 345/212 |
| 2016/0293101 | A1* | 10/2016 | Jeong | G09G 3/3258 |
| 2017/0192065 | A1* | 7/2017 | Lee | G09G 3/3283 |
| 2020/0251045 | A1* | 8/2020 | An | G09G 3/32 |
| 2021/0201781 | A1* | 7/2021 | Kim | G09G 3/3258 |
| 2021/0256904 | A1* | 8/2021 | Kang | G09G 3/3225 |

FOREIGN PATENT DOCUMENTS

| | | |
|---|---|---|
| KR | 10-2174856 B1 | 11/2020 |
| KR | 10-2278326 B1 | 7/2021 |

\* cited by examiner

DISPLAY DEVICE

CROSS-REFERENCE TO RELATED APPLICATIONS

This application claims priority under 35 U.S.C. § 119 to Korean Patent Application No. 10-2022-0033224 filed on Mar. 17, 2022, in the Korean Intellectual Property Office, the disclosures of which are incorporated by reference herein in their entireties.

BACKGROUND

1. Filed of the Disclosure

The present disclosure generally relates to a display device, and more particularly, relates to a display device capable of preventing a display panel from being damaged caused by poor communication with a current sensor.

2. Description of the Related Art

A light emitting display device among display devices displays an image by using a light emitting diode that generates a light through the recombination of electrons and holes. The light emitting display device has a fast response speed and is driven with low power consumption.

The light emitting display device includes pixels connected to data lines and scan lines. In general, each of the pixels includes a light emitting element and a pixel circuit unit for controlling the amount of current flowing to the light emitting element. In response to a data signal, the pixel circuit unit may control the amount of current that flows from a terminal, to which a first driving voltage is applied, to a terminal, to which a second driving voltage is applied, via the light emitting element. In this case, a light having predetermined luminance is generated to correspond to the amount of current flowing through the light emitting element.

SUMMARY

Embodiments of the present disclosure provide a display device for preventing a display panel from being damaged caused by poor communication with a current sensor.

According to an embodiment, a display device includes a display panel, a voltage generator, a current detector, and a current controller. The display panel includes a pixel receiving a driving voltage. The voltage generator generates the driving voltage, determines a voltage level of the driving voltage based on a voltage control signal, and performs a protection operation in response to a protection signal.

The current detector detects a driving current of the display panel and outputs a current signal corresponding to the detected driving current. The current controller receives the current signal from the current detector, calculates a load based on an input image data, sets a target current corresponding to the load, and outputs the voltage control signal by comparing a current level of the target current with a current level of the current signal.

The current controller includes a current comparison unit that generates a result signal by comparing a present current level of the current signal with a previous current level of the current signal and a protection operating unit that receives the result signal and outputs the protection signal based on a change in the load and a difference between the target current and the current signal.

According to an embodiment, a display device includes a display panel, a voltage generator, a current detector, and a current controller. The display panel includes a pixel receiving a driving voltage. The voltage generator generates the driving voltage, determines a voltage level of the driving voltage based on a voltage control signal, and performs a protection operation in response to a protection signal.

The current detector detects a driving current of the display panel and outputs a current signal corresponding to the detected driving current. The current controller receives the current signal from the current detector, calculates a load based on an input image data, sets a target current corresponding to the load, and outputs the voltage control signal by comparing a current level of the target current with a current level of the current signal.

The current detector terminates a transmission of the current signal and further transmits a response signal to the current controller. The current controller includes a protection operating unit that determines whether to output protection signal based on whether the response signal is received.

BRIEF DESCRIPTION OF THE DRAWINGS

The above and other objects and features of the present disclosure will become apparent by describing in detail embodiments thereof with reference to the accompanying drawings.

DETAILED DESCRIPTION

Figure 1:
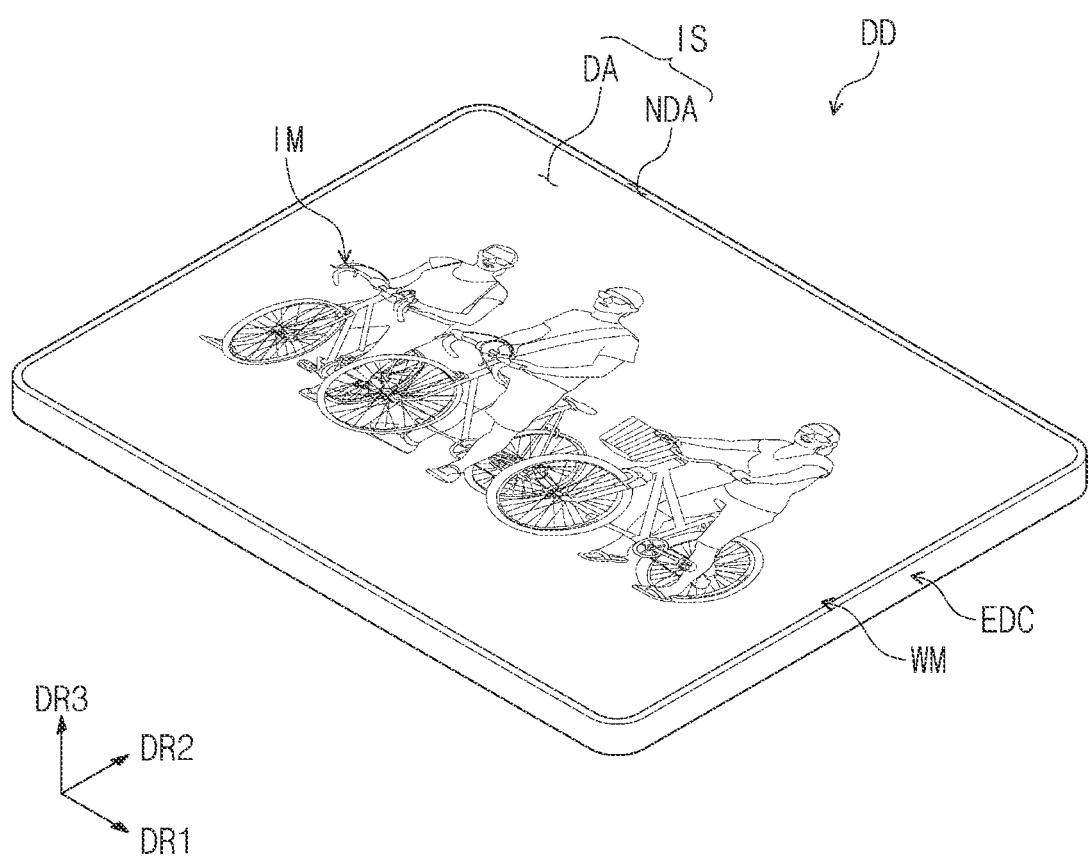
FIG. 1 is a perspective view of a display device according to an embodiment of the present disclosure.

In the specification, the expression that a first component (or region, layer, part, portion, etc.) is "on", "connected with", or "coupled with" a second component means that the first component is directly on, connected with, or coupled with the second component or means that a third component is interposed therebetween.

The same reference numerals refer to the same components. Also, in drawings, the thickness, ratio, and dimension of components are exaggerated for effectiveness of description of technical contents. The expression "and/or" includes one or more combinations which associated components are capable of defining.

Although the terms "first", "second", etc. may be used to describe various components, the components should not be construed as being limited by the terms. The terms are only used to distinguish one component from another component. For example, without departing from the scope and spirit of the present disclosure, a first component may be referred to as a second component, and similarly, the second component may be referred to as the first component. The articles "a", "an", and "the" are singular in that they have a single referent, but the use of the singular form in the specification should not preclude the presence of more than one referent.

Also, the terms "under", "below", "on", "above", etc. are used to describe the correlation of components illustrated in drawings. The terms that are relative in concept are described based on a direction shown in drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in the specification have the same meaning as commonly understood by one skilled in the art to which the present disclosure belongs. Furthermore, terms such as terms defined in the dictionaries commonly used should be interpreted as having a meaning consistent with the meaning in the context of the related technology, and should not be interpreted in ideal or overly formal meanings unless explicitly defined herein.

Hereinafter, embodiments of the present disclosure will be described with reference to accompanying drawings.

Figure 2:
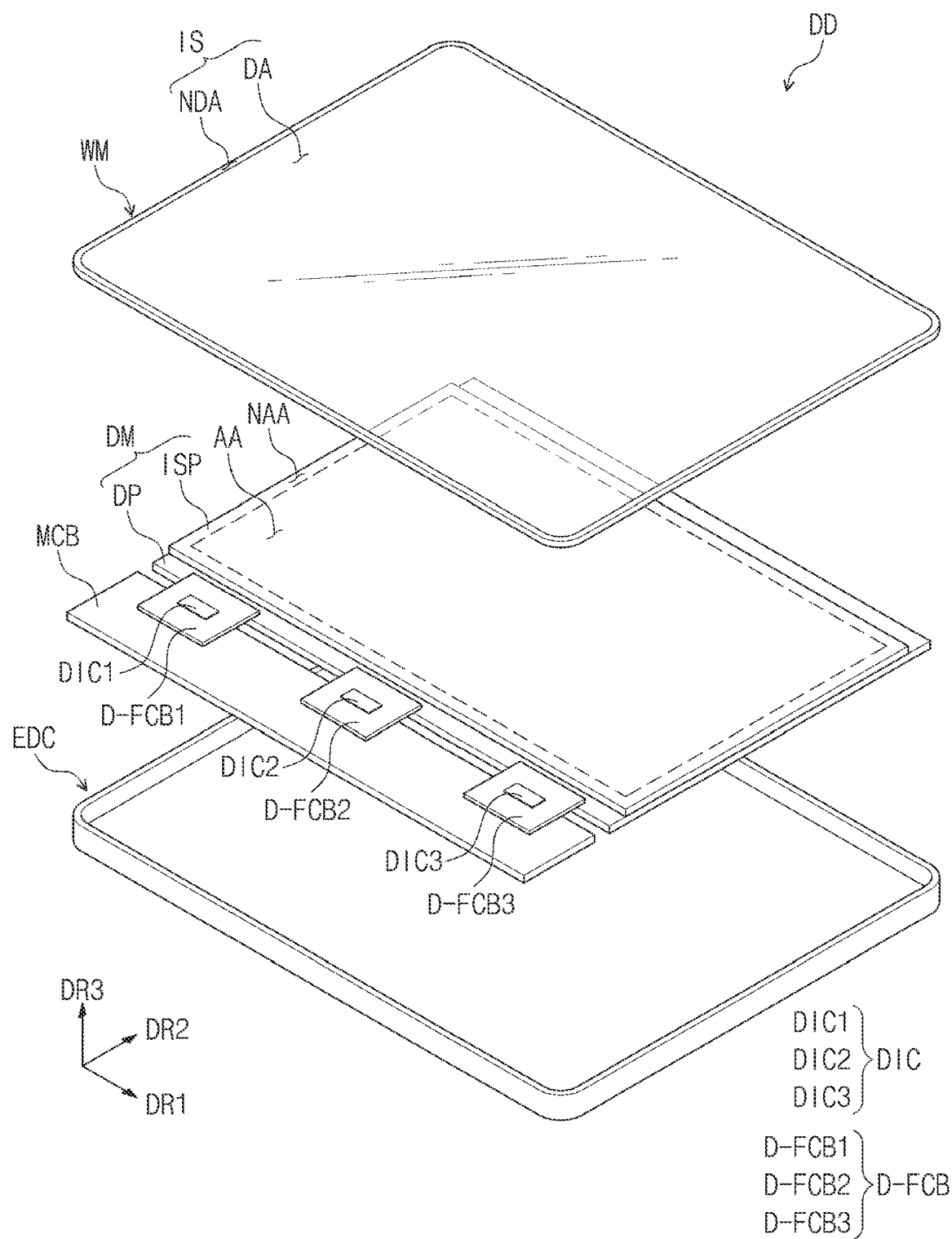
FIG. 2 is an exploded perspective view of a display device according to an embodiment of the present disclosure.

FIG. 1 is a perspective view of a display device according to an embodiment of the present disclosure. FIG. 2 is an exploded perspective view of a display device according to an embodiment of the present disclosure.

Referring to FIGS. 1 and 2, a display device DD may be a device activated depending on an electrical signal. The display device DD according to the present disclosure may be a small and medium-sized electronic device, such as a mobile phone, a tablet PC, a notebook computer, a vehicle navigation system, or a game console, as well as a large-sized electronic device, such as a television or a monitor. The above examples are provided only as examples, and it is obvious that the display device DD may be applied to any other display device(s) without departing from the concept of the present disclosure. The display device DD is in a shape of a rectangle having a long side in a first direction DR1 and a short side in a second direction DR2 intersecting the first direction DR1. However, the shape of the display device DD is not limited thereto. For example, the display device DD may be implemented in various shapes. The display device DD may display an image IM on a display surface IS parallel to each of the first direction DR1 and the second direction DR2, so as to face a third direction DR3. The display surface IS on which the image IM is displayed may correspond to a front surface of the display device DD.

In an embodiment, a front surface (or an upper/top surface) and a rear surface (or a lower/bottom surface) of each member are defined based on a direction in which the image IM is displayed. The front surface may be opposite to the rear surface in the third direction DR3, and a normal direction of each of the front surface and the rear surface may be parallel to the third direction DR3.

A separation distance between the front surface and the rear surface in the third direction DR3 may correspond to a thickness of the display device DD in the third direction DR3. Meanwhile, directions that the first, second, and third directions DR1, DR2, and DR3 indicate may be relative in concept and may be changed to different directions.

The display device DD may sense an external input applied from the outside. The external input may include various types of inputs that are provided from the outside of the display device DD. The display device DD according to an embodiment of the present disclosure may sense an external input of a user, which is applied from the outside. The external input of the user may be one of various types of external inputs, such as a part of his/her body, light, heat, his/her gaze, and pressure, or a combination thereof. Also, the display device DD may sense the external input of the user applied to a side surface or a rear surface of the display device DD depending on a structure of the display device DD and is not limited to an embodiment. As an example of the present disclosure, an external input may include an input entered through an input device (e.g., a stylus pen, an active pen, a touch pen, an electronic pen, or an E-pen).

The display surface IS of the display device DD may be divided into a display area DA and a non-display area NDA. The display area DA may be an area in which the image IM is displayed. The user perceives (or views) the image IM through the display area DA. In an embodiment, the display area DA is illustrated in the shape of a quadrangle whose vertexes are rounded. However, this is illustrated as an example. The display area DA may have various shapes, not limited to an embodiment.

The non-display area NDA is adjacent to the display area DA. The non-display area NDA may have a given color. The non-display area NDA may surround the display area DA. Accordingly, a shape of the display area DA may be defined substantially by the non-display area NDA. However, this is illustrated as an example. The non-display area NDA may be disposed adjacent to only one side of the display area DA or may be omitted. The display device DD according to an embodiment of the present disclosure may include various embodiments and is not limited to an embodiment.

As illustrated in FIG. 2, the display device DD may include a display module DM and a window WM disposed on the display module DM. The display module DM may include a display panel DP and an input sensing layer ISP.

According to an embodiment of the present disclosure, the display panel DP may include a light emitting display panel. For example, the display panel DP may be an organic light emitting display panel, an inorganic light emitting display panel, a quantum dot light emitting display panel. An emission layer of the organic light emitting display layer may include an organic light emitting material. An emission layer of the inorganic light emitting display panel may include an inorganic light emitting material. An emission layer of the quantum dot light emitting display panel may include a quantum dot, a quantum rod, or the like.

The display panel DP may output the image IM, and the image IM may be displayed through the display surface IS.

The input sensing layer ISP may be disposed on the display panel DP to sense an external input. The input sensing layer ISP may be directly disposed on the display panel DP. According to an embodiment of the present disclosure, the input sensing layer ISP may be formed on the display panel DP by a subsequent process. That is, when the input sensing layer ISP is directly disposed on the display panel DP, an inner adhesive film (not illustrated) is not interposed between the input sensing layer ISP and the display panel DP. However, the inner adhesive film may be interposed between the input sensing layer ISP and the display panel DP. In this case, the input sensing layer ISP is not manufactured together with the display panel DP through the subsequent processes. That is, the input sensing layer ISP may be manufactured through a process separate from that of the display panel DP and may then be fixed on an upper surface of the display panel DP by the inner adhesive film.

The window WM may be formed of a transparent material capable of outputting the image IM. For example, the window WM may be formed of glass, sapphire, plastic, etc. It is illustrated that the window WM is implemented with a single layer. However, an embodiment is not limited thereto. For example, the window WM may include a plurality of layers.

Meanwhile, although not illustrated, the non-display area NDA of the display device DD described above may correspond to an area that is defined by printing a material including a given color on one area of the window WM. As an example of the present disclosure, the window WM may include a light blocking pattern for defining the non-display area NDA. The light blocking pattern may be formed by a coating method, as a colored organic film.

The window WM may be coupled to the display module DM through an adhesive film. As an example of the present disclosure, the adhesive film may include an optically clear adhesive (OCA) film. However, the adhesive film is not limited thereto. For example, the adhesive film may include a typical adhesive or sticking agent. For example, the adhesive film may include an optically clear resin (OCR) or a pressure sensitive adhesive (PSA) film.

An anti-reflection layer may be further interposed between the window WM and the display module DM. The anti-reflection layer decreases the reflectivity of external light incident from above the window WM. The anti-reflection layer according to an embodiment of the present disclosure may include a retarder and a polarizer. The retarder may have a film type or a liquid crystal coating type and may include a $\lambda/2$ retarder and/or a $\lambda/4$ retarder. The polarizer may also have a film type or a liquid crystal coating type. The film type may include a stretch-type synthetic resin film, and the liquid crystal coating type may include liquid crystals arranged in a given direction. The retarder and the polarizer may be implemented with one polarization film.

As an example of the present disclosure, the anti-reflection layer may also include color filters. The arrangement of the color filters may be determined in consideration of colors of light generated from a plurality of pixels PX (see FIG. 3) included in the display panel DP. In this case, the anti-reflection layer may further include a light blocking pattern disposed between the color filters.

The display module DM may display the image IM depending on an electrical signal and may transmit/receive information about an external input. The display module DM may be defined by an active area AA and an inactive area NAA. The active area AA may be defined as an area (i.e., an area where the image IM is displayed) through which the image IM is output from the display panel DP. Also, the active area AA may be defined as an area in which the input sensing layer ISP senses an external input applied from the outside. According to an embodiment, the active area AA of the display module DM may correspond to (or overlap along the third direction DR3) at least a part of the display area DA.

The inactive area NAA is adjacent to the active area AA. The inactive area NAA may be an area in which the image IM is not substantially displayed. For example, the inactive area NAA may surround the active area AA. However, this is illustrated by way of example. The inactive area NAA may be defined in various shapes, not limited to an embodiment. According to an embodiment, the inactive area NAA of the display module DM may correspond to (or overlap along the third direction DR3) at least part of the non-display area NDA.

The display module DM may further include a main circuit board MCB, flexible circuit films D-FCB, and driver chips DIC. The main circuit board MCB may be connected to the flexible circuit films D-FCB so as to be electrically connected to the display panel DP. The flexible circuit films D-FCB are connected to the display panel DP so as to electrically connect the display panel DP to the main circuit board MCB. The main circuit board MCB may include a plurality of driving elements. The plurality of driving elements may include a circuit unit for driving the display panel DP. The driver chips DIC may be mounted on the flexible circuit films D-FCB, respectively.

As an example of the present disclosure, the flexible circuit films D-FCB may include a first flexible circuit film D-FCB1, a second flexible circuit film D-FCB2, and a third flexible circuit film D-FCB3. According to an embodiment of the present disclosure, the driver chips DIC may include a first driver chip DIC1, a second driver chip DIC2, and a third driver chip DIC3. The first to third flexible circuit films D-FCB1, D-FCB2, and D-FCB3 may be positioned spaced from one another in the first direction DR1 and may be connected with the display panel DP so as to electrically connect the display panel DP and the main circuit board MCB. The first driver chip DIC1 may be mounted on the first flexible circuit film D-FCB1. The second driver chip DIC2 may be mounted on the second flexible circuit film D-FCB2. The third driver chip DIC3 may be mounted on the third flexible circuit film D-FCB3. However, an embodiment of the present disclosure is not limited thereto. For example, the display panel DP may be electrically connected with the main circuit board MCB through one flexible circuit film, and only one driver chip may be mounted on the one flexible circuit film. Also, the display panel DP may be electrically connected with the main circuit board MCB through four or more flexible circuit films, and driver chips may be respectively mounted on the flexible circuit films.

A structure in which the first to third driver chips DIC1, DIC2, and DIC3 are respectively mounted on the first to third flexible circuit films D-FCB1, D-FCB2, and D-FCB3 is illustrated in FIG. 2, but the present disclosure is not limited thereto. For example, the first to third driver chips DIC1, DIC2, and DIC3 may be directly mounted on the display panel DP. In this case, a portion of the display panel DP, on which the first to third driver chips DIC1, DIC2, and DIC3 are mounted, may be bent such that the first to third driver chips DIC1, DIC2, and DIC3 are disposed on a rear surface of the display module DM. Alternatively, the first to third driver chips DIC1, DIC2, and DIC3 may be directly mounted on the main circuit board MCB.

The input sensing layer ISP may be electrically connected with the main circuit board MCB through the flexible circuit films D-FCB. However, an embodiment of the present disclosure is not limited thereto. That is, the display module DM may additionally include a separate flexible circuit film for electrically connecting the input sensing layer ISP and the main circuit board MCB.

The display device DD further includes an outer case EDC accommodating the display module DM. The outer case EDC may be coupled to the window WM so as to define an exterior appearance of the display device DD. The outer case EDC may absorb external shocks and may prevent a foreign material/moisture or the like from being infiltrated into the display module DM such that components accommodated in the outer case EDC are protected. Meanwhile, as an example of the present disclosure, the outer case EDC may be provided in the form of a combination of a plurality of accommodating members.

The display device DD according to an embodiment may further include an electronic module including various functional modules for operating the display module DM, a power supply module (e.g., a battery) for supplying a power necessary for overall operations of the display device DD, a bracket coupled with the display module DM and/or the outer case EDC to partition an inner space of the display device DD, etc.

Figure 3:
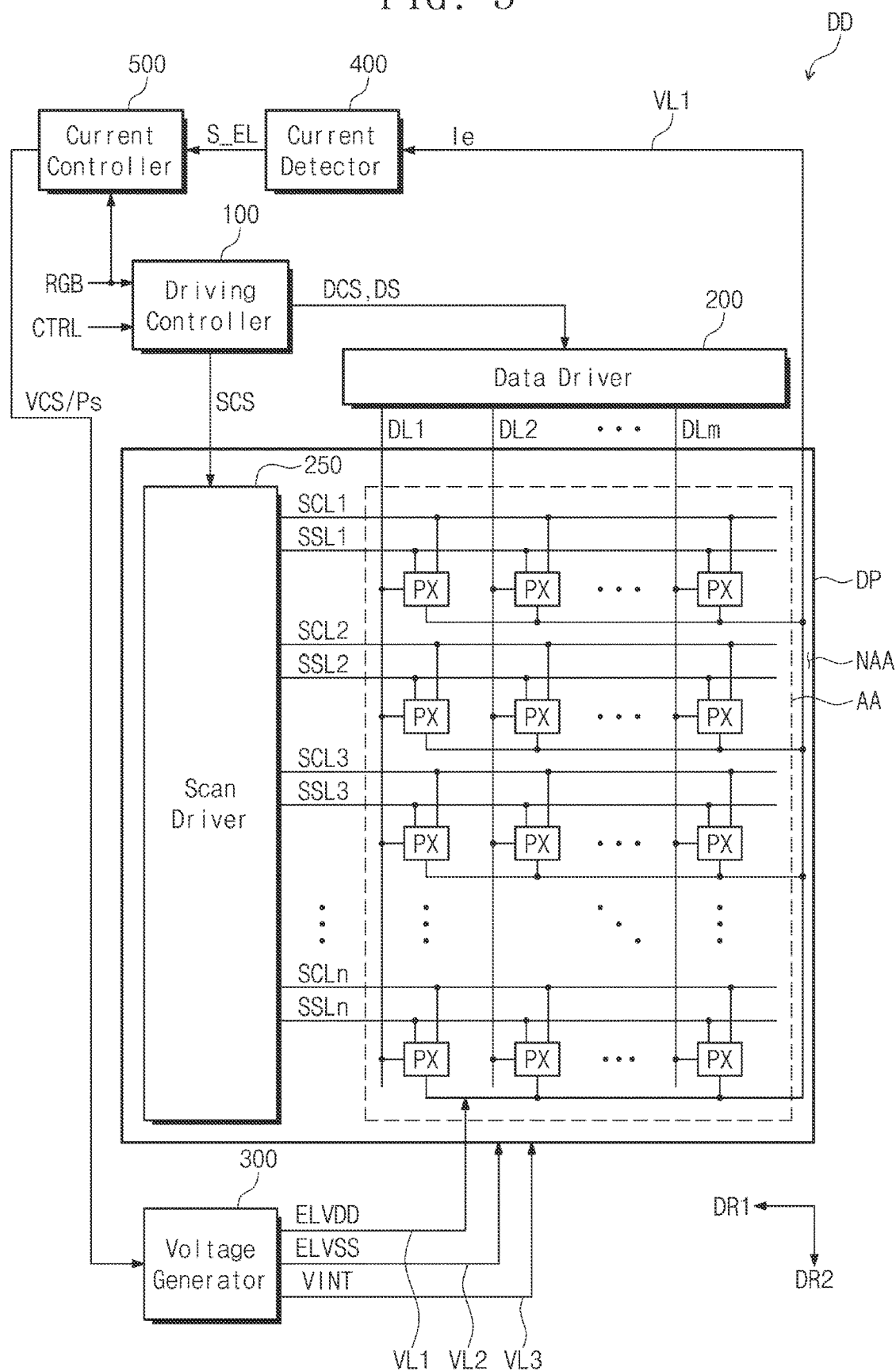
FIG. 3 is a block diagram of a display device according to an embodiment of the present disclosure.

FIG. 3 is a block diagram of a display device according to an embodiment of the present disclosure.

Referring to FIG. 3, the display device DD includes a driving controller 100, a data driver 200, a scan driver 250, a voltage generator 300, a current detector 400, a current controller 500, and the display panel DP.

The driving controller 100 receives an input image signal RGB and a control signal CTRL from a main controller. The driving controller 100 generates image data DS by converting a data format of the image signal RGB in compliance with the specification for an interface with the data driver 200. The driving controller 100 outputs a scan control signal SCS and a data control signal DCS.

The data driver 200 receives the data control signal DCS and the image data DS from the driving controller 100. The data driver 200 converts the image data DS into data signals (or data voltages) and outputs the data signals to a plurality of data lines DL1 to DLm to be described later. The data signals refer to analog voltages corresponding to grayscale values of the image data signal DS. The data driver 200 may be disposed in the driver chips DIC shown in FIG. 2.

The scan driver 250 receives the scan control signal SCS from the driving controller 100. In response to the scan control signal SCS, the scan driver 250 may output first scan signals to first scan lines SCL1 to SCLn to be described later and may output second scan signals to second scan lines SSL1 to SSLn to be described later.

The display panel DP includes the first scan lines SCL1 to SCLn, the second scan lines SSL1 to SSLn, the data lines DL1 to DLm, and pixels PX. The display panel DP may be divided into the active area AA and the inactive area NAA. The pixels PX may be positioned in the active area AA. The scan driver 250 may be positioned in the inactive area NAA.

The first scan lines SCL1 to SCLn and the second scan lines SSL1 to SSLn extend in parallel with the first direction DR1 and are arranged spaced from each other in the second direction DR2. The data lines DL1 to DLm extend from the data driver 200 in parallel with the second direction DR2 and are arranged spaced from each other in the first direction DR1.

The plurality of pixels PX are electrically connected to the first scan lines SCL1 to SCLn, the second scan lines SSL1 to SSLn, and the data lines DL1 to DLm. For example, the first row of pixels may be connected to the scan lines SCL1 and SSL1. Moreover, the second row of pixels may be connected to the scan lines SCL2 and SSL2.

Each of the plurality of pixels PX includes a light emitting element ED (see FIG. 4) and a pixel circuit unit PXC (see FIG. 4) for controlling the emission of the light emitting element ED. The pixel circuit unit PXC may include a plurality of transistors and a capacitor. The scan driver 250 may include transistors formed through the same process as the pixel circuit unit PXC. In an embodiment, the light emitting element ED may be an organic light emitting diode. However, the present disclosure is not limited thereto.

In an embodiment, the scan driver 250 may be arranged on a first side of the display panel DP. The first scan lines SCL1 to SCLn and the second scan lines SSL1 to SSLn extend from the scan driver 250 in parallel with the first direction DR1. The scan driver 250 is positioned adjacent to a first side of the active area AA, but the present disclosure is not limited thereto. In an embodiment, the scan driver 250 may be positioned adjacent to the first side and the second side of the active area AA. For example, the scan driving circuit positioned adjacent to the first side of the active area AA may provide the first scan signals to the first scan lines SCL1 to SCLn, and the scan driving circuit positioned adjacent to the second side of the active area AA may provide the second scan signals to the second scan lines SSL1 to SSLn.

Each of the plurality of pixels PX receives a first driving voltage ELVDD, a second driving voltage ELVSS, and an initialization voltage VINT.

The voltage generator 300 generates voltages necessary to operate the display panel DP. In an embodiment of the present disclosure, the voltage generator 300 generates a first driving voltage ELVDD, a second driving voltage ELVSS, and an initialization voltage VINT, which are necessary for an operation of the display panel DP. The first driving voltage ELVDD, the second driving voltage ELVSS, and the initialization voltage VINT may be provided to the display panel DP through a first voltage line VL1 (or a voltage line), a second voltage line VL2, and a third voltage line VL3.

As well as the first driving voltage ELVDD, the second driving voltage ELVSS, and the initialization voltage VINT, the voltage generator 300 may further generate various voltages necessary for operations of the display panel DP and the scan driver 250.

The current detector 400 is connected to the first voltage line VL1 and detects a driving current Ie flowing through the first voltage line VL1 in units of detection frames. The current detector 400 generates a current signal S_EL corresponding to the detected level of the driving current Ie and provides the current signal S_EL corresponding to the current detection frame to the current controller 500. The current controller 500 may receive the current signal S_EL from the current detector 400 and may generate a voltage control signal VCS for controlling the voltage generator 300 based on the current signal S_EL. The generated voltage control signal VCS may be supplied to the voltage generator 300, and the voltage generator 300 may adjust a voltage level of the first driving voltage ELVDD in response to the voltage control signal VCS. The driving current Ie may be adjusted to a level corresponding to a desired current (a target current) by the adjusted first driving voltage ELVDD.

As an example of the present disclosure, the current detector 400, the current controller 500, and the driving controller 100 illustrated in FIG. 3 may be mounted on the main circuit board MCB illustrated in FIG. 2. As an example of the present disclosure, the current controller 500 may be embedded in the main controller. Alternatively, the current detector 400 and the current controller 500 may be mounted on the main circuit board MCB, and the driving controller 100 may be positioned in the driving chips DIC shown in FIG. 2 together with the data driver 200. In FIG. 3, the current detector 400 is illustrated as being independent of the driving controller 100, but the present disclosure is not limited thereto. For example, the current detector 400 and the driving controller 100 may be integrated into one configuration (e.g., a main controller). The current detector 400 may communicate with the current controller 500 in a manner of I2C interface. That is, the current detector 400 may transmit the current signal S_EL to the current controller 500 in the manner of I2C interface.

Figure 4:
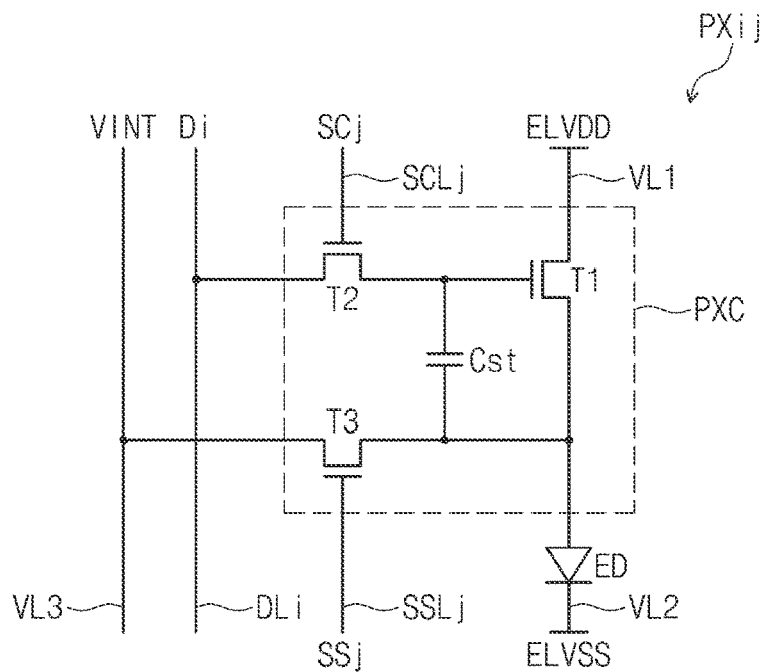
FIG. 4 is an equivalent circuit diagram of a pixel, according to an embodiment of the present disclosure.

FIG. 4 is an equivalent circuit diagram of a pixel, according to an embodiment of the present disclosure.

FIG. 4 illustrates an equivalent circuit diagram of a pixel PXij connected to an i-th data line DLi among the data lines DL1 to DLm, a j-th first scan line SCLj among the first scan lines SCL1 to SCLn, and a j-th second scan line SSLj among the second scan lines SSL1 to SSLn, which are illustrated in FIG. 1.

Each of the plurality of pixels PX shown in FIG. 3 may have the same circuit configuration as the equivalent circuit of the pixel PXij shown in FIG. 4. In an embodiment, the pixel PXij includes the at least one light emitting element ED and the pixel circuit unit PXC.

The pixel circuit unit PXC may include at least one transistor, which is electrically connected to the light emitting element ED and which is used to provide a current corresponding to the data signal Di delivered from the data line DLi to the light emitting element ED. As an example of the present disclosure, the pixel circuit unit PXC of the pixel PXij includes a first transistor T1, a second transistor T2, a third transistor T3, and a capacitor Cst. Each of the first to third transistors T1 to T3 may be an N-type transistor by using an oxide semiconductor as a semiconductor layer. However, the present disclosure is not limited thereto. For example, each of the first to third transistors T1, T2, and T3 may be a P-type transistor having a low-temperature polycrystalline silicon (LTPS) semiconductor layer. Alternatively, at least one of the first to third transistors T1, T2, and T3 may be an N-type transistor and the others thereof may be P-type transistors.

Referring to FIG. 4, the first scan line SCLj may deliver the first scan signal SCj, and the second scan line SSLj may deliver the second scan signal SSj. The data line DLi transfers a data signal Di. The data signal Di may have a voltage level corresponding to the input image signal RGB that is input to the display device DD (see FIG. 1).

The first driving voltage ELVDD and the initialization voltage VINT may be delivered to the pixel circuit unit PXC through the first voltage line VL1 and the third voltage line VL3. The second driving voltage ELVSS may be delivered to a cathode (or a second terminal) of the light emitting element ED through the second voltage line VL2.

The first transistor T1 includes a first electrode connected to the first voltage line VL1, a second electrode electrically connected to an anode (or a first terminal) of the light emitting element ED, and a gate electrode connected to one end of the capacitor Cst. The first transistor T1 may supply an emission current to the light emitting element ED in response to the data signal Di delivered through the data line DLi depending on a switching operation of the second transistor T2.

The second transistor T2 includes a first electrode connected to the data line DLi, a second electrode connected to the gate electrode of the first transistor T1, and a gate electrode connected to the first scan line SCLj. The second transistor T2 may be turned on in response to a first scan signal SCj received through the first scan line SCLj so as to deliver the data signal Di delivered through the data line DLi to the gate electrode of the first transistor T1.

The third transistor T3 includes a first electrode connected to the third voltage line VL3, a second electrode connected to the anode of the light emitting element ED, and a gate electrode connected to the second scan line SSLj. The third transistor T3 may be turned on in response to a second scan signal SSj received through the second scan line SSLj so as to deliver the initialization voltage VINT to the anode of the light emitting element ED.

As described above, one end of the capacitor Cst is connected to the gate electrode of the first transistor T1, and the other end of the capacitor Cst is connected to the second electrode of the first transistor T1. The structure of the pixel PXij according to an embodiment is not limited to the structure illustrated in FIG. 4. The number of transistors included in the pixel PXij, the number of capacitors, and the connection relationship may be modified in various manners.

Figure 5:
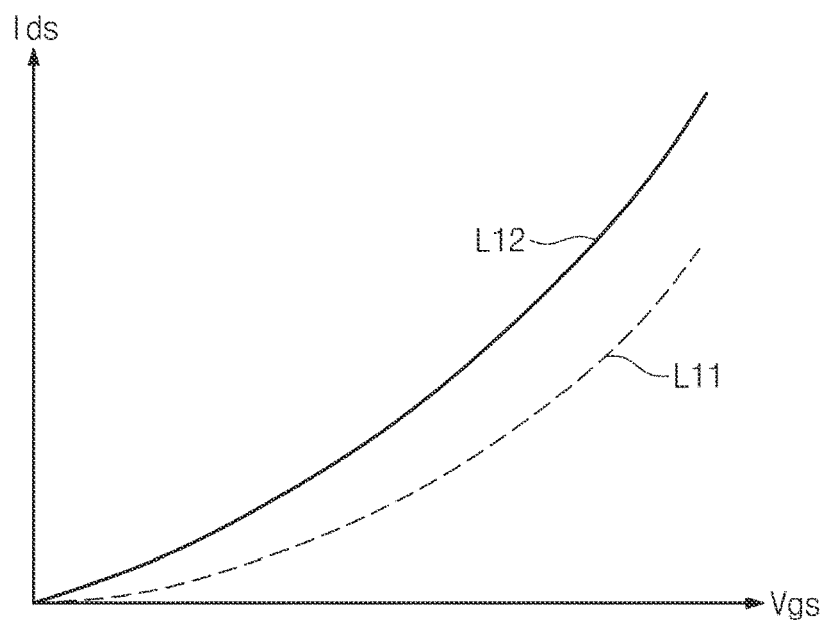
FIG. 5 is a diagram illustrating a current-voltage characteristic of the first transistor shown in FIG. 4.

FIG. 5 is a diagram illustrating a current-voltage characteristic of the first transistor shown in FIG. 4.

Referring to FIGS. 4 and 5, in the first transistor T1, a current Ids flowing from the first electrode to the second electrode of the first transistor T1 may change depending on a voltage Vgs between the gate electrode and the second electrode.

The current-voltage characteristic of the first transistor T1 may vary depending on a voltage level of the first driving voltage ELVDD.

In FIG. 5, a first curve L11 shows the current-voltage characteristic of the first transistor T1 when the first driving voltage ELVDD has a first voltage level, and a second curve L12 shows the current-voltage characteristic of the first transistor T1 when the first driving voltage ELVDD has a second voltage level higher than the first voltage level.

As can be seen in FIG. 5, as a voltage level of the first driving voltage ELVDD increases, the current Ids flowing from the first electrode to the second electrode of the first transistor T1 increases. That is, the emission current of the light emitting device ED may be controlled by adjusting the first driving voltage ELVDD.

Figure 6:
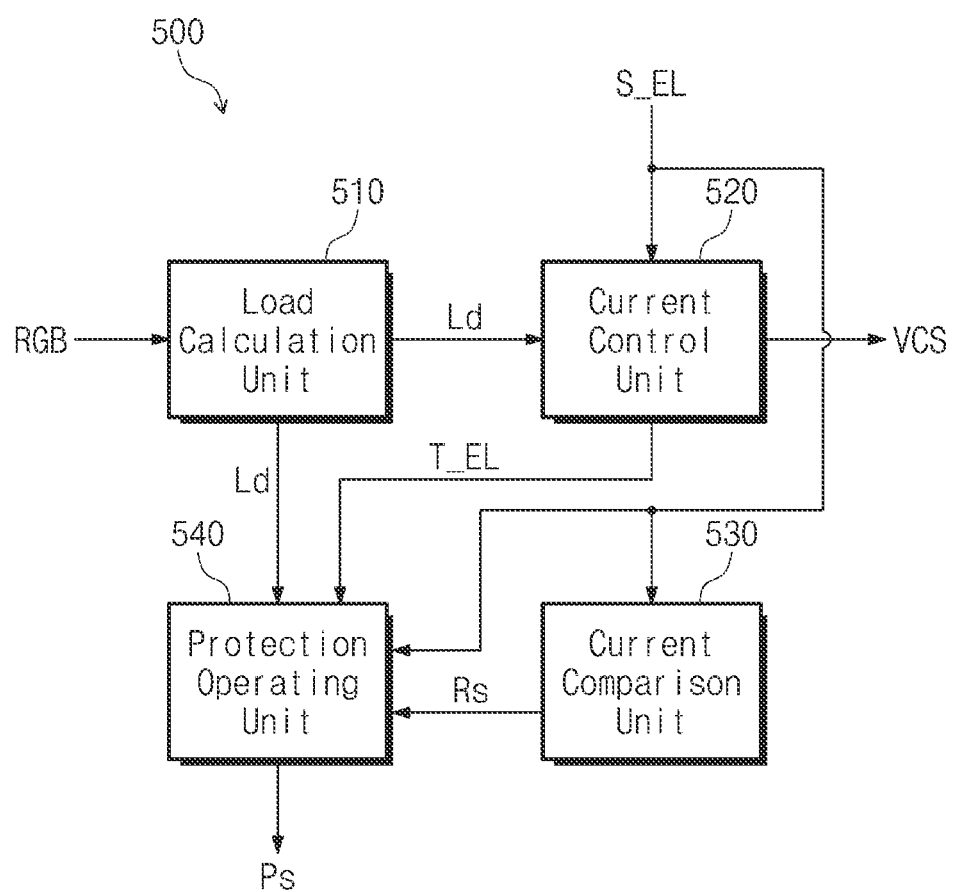
FIG. 6 is an internal block diagram of a current controller according to an embodiment of the present disclosure.
Figure 7:
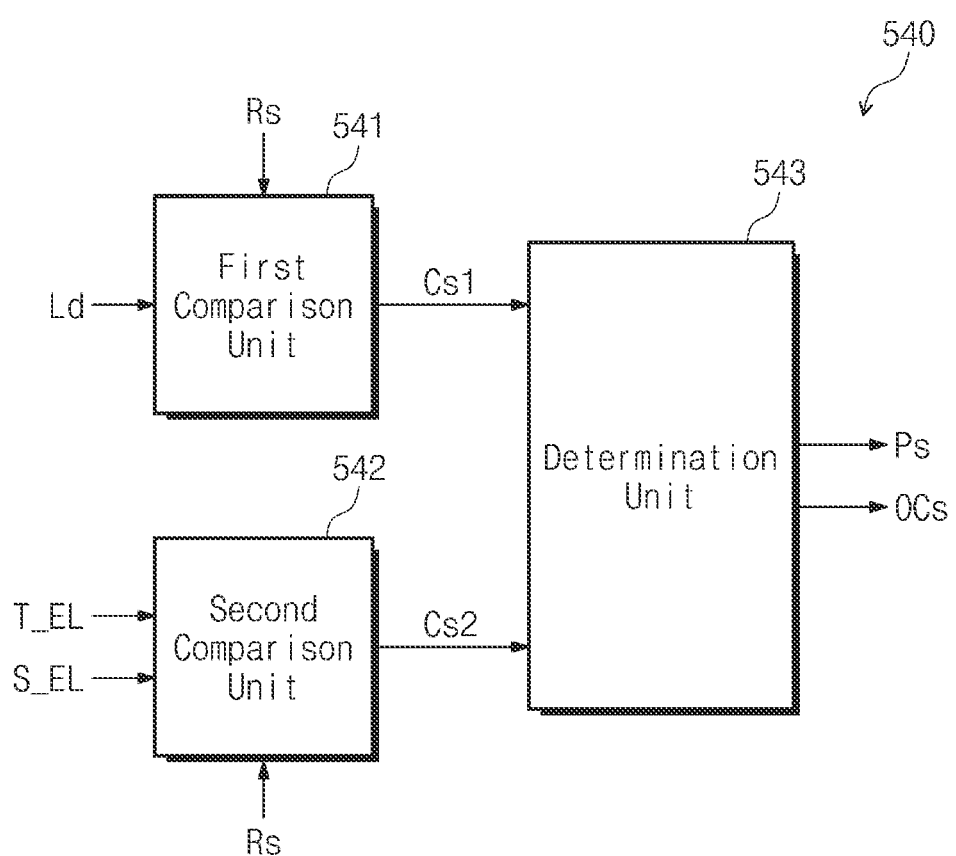
FIG. 7 is an internal block diagram of a protection operating unit according to an embodiment of the present disclosure.
Figure 8A:
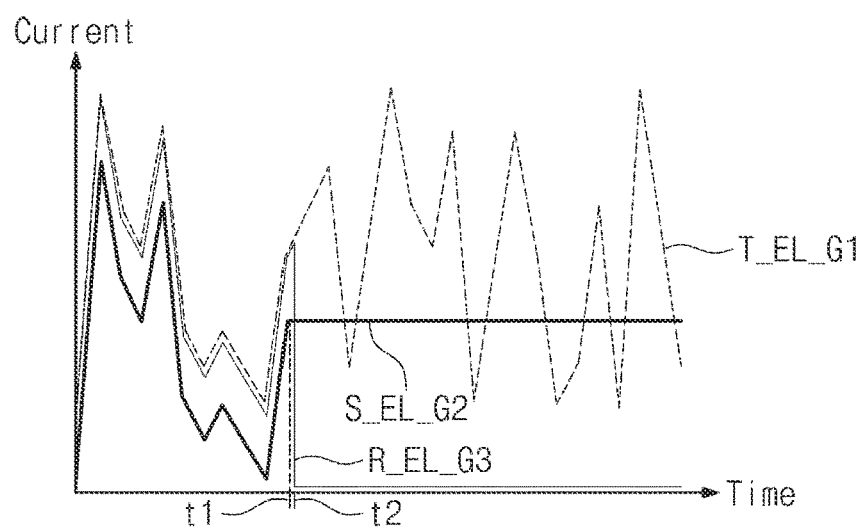
FIGS. 8A and 8B are diagrams for describing an operation of the protection operation unit shown in FIG. 7.
Figure 8B:
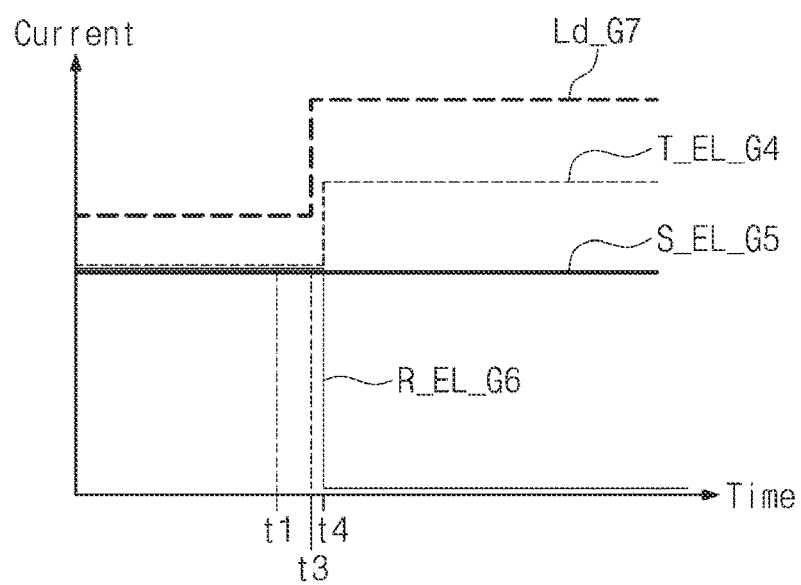

FIG. 6 is an internal block diagram of a current controller thus illustrated, according to an embodiment of the present disclosure. FIG. 7 is an internal block diagram of a protection operating unit according to an embodiment of the present disclosure. FIGS. 8A and 8B are diagrams for describing an operation of the protection operation unit shown in FIG. 7.

Referring to FIGS. 6 and 7, the current controller 500 includes a load calculation unit 510, a current controller 520, a current comparison unit 530, and a protection operating unit 540.

The load calculation unit 510 receives the input image signal RGB from the main controller, and calculates a load Ld based on the input image signal RGB. The current controller 520 receives the current signal S_EL from the current detector 400 and the load Ld from the load calculation unit 510. The current controller 520 sets a target current T_EL corresponding to the received load Ld, and outputs the voltage control signal VCS by comparing the current level of the target current T_EL with the current level of the current signal S_EL. For example, when the current level of the target current T_EL is less than the current level of the current signal S_EL, the current controller 520 may output the voltage control signal VCS for decreasing a voltage level of the first driving voltage ELVDD. When the current level of the target current T_EL is greater than the current level of the current signal S_EL, the current controller 520 may output the voltage control signal VCS for increasing a voltage level of the first driving voltage ELVDD. Furthermore, when the current level of the target current T_EL is the same as the current level of the current signal S_EL, the current controller 520 may output the voltage control signal VCS to prevent the voltage level of the first driving voltage ELVDD from being changed.

The current comparison unit 530 may receive and store the current signal S_EL from the current detector 400. Moreover, the current comparison unit 530 may generate a result signal Rs by comparing a present current level of the received current signal S_EL (e.g., referred to as a "present current signal") with a previous current level of the previous current signal thus previously stored. Here, the previous current signal may be a current signal received from the current detector 400 in the previous detection frame. When the present current level of the current signal S_EL is different from the previous current level of the previous current signal, the current comparison unit 530 may output the result signal Rs in an inactive state. When the present current level of the current signal S_EL is the same as the previous current level of the previous current signal, the current comparison unit 530 may output the result signal Rs in an active state.

The protection operating unit 540 may receive the result signal Rs from the current comparison unit 530 and may receive the load Ld from the load calculation unit 510. Besides, the protection operating unit 540 may receive the target current T_EL from the current controller 520.

The protection operating unit 540 may be activated in response to the result signal Rs of the active state, and may output a protection signal Ps based on a change in the load Ld and a difference in level between the target current T_EL and the current signal S_EL. When the protection operating unit 540 receives the result signal Rs of the inactive state, the protection operating unit 540 may not output the protection signal Ps while being maintained in an inactive state.

As an example of the present disclosure, the protection operating unit 540 includes a first comparison unit 541, a second comparison unit 542, and a determination unit 543. The first comparison unit 541 may be activated in response to the result signal Rs of the active state, and may output a first comparison signal Cs1 by comparing a level (hereinafter referred to as a "present level") of the load Ld (e.g., referred to as a "present load") received from the load calculation unit 510 with a level (hereinafter referred to as a "previous level") of the pre-stored previous load. Here, the previous load may be defined as a load generated based on a current signal (i.e., a previous current signal) received in the previous detection frame. The first comparison signal Cs1 may include information about a result of comparing the present level and the previous level of the load Ld.

The second comparison unit 542 is activated in response to the result signal Rs of the active state, and the second comparison unit 542 outputs a second comparison signal Cs2 by comparing the current level of the target current T_EL with the current level of the current signal S_EL. The second comparison signal Cs2 may include information about a result of comparing the current level of the target current T_EL with the current level of the current signal S_EL.

The determination unit 543 determines whether to activate the protection signal Ps based on the first and second comparison signals Cs1 and Cs2. In detail, when the present level of the load Ld is greater than the previous level of the load Ld and the current level of the target current T_EL is not the same as the current level of the current signal S_EL, the determination unit 543 outputs the protection signal Ps. Furthermore, even though the present level of the load Ld and the previous level are the same, when the current level of the target current T_EL is not the same as the current level of the current signal S_EL, the determination unit 543 outputs the protection signal Ps. The protection signal Ps thus output may be provided to the voltage generator 300 (see FIG. 3). When the voltage generator 300 receives the protection signal Ps, the voltage generator 300 may perform a protection operation. As an example of the present disclosure, the voltage generator 300 may perform the protection operation of stopping the output of the first driving voltage ELVDD. When the first driving voltage ELVDD is not output from the voltage generator 300, the operation of the display panel DP may be shut down.

As an example of the present disclosure, when the present level of the load Ld is less than the previous level and the current level of the target current T_EL is less than the current level of the current signal S_EL, the determination unit 543 may output an overcurrent control signal OCs without outputting the protection signal Ps. In this case, the voltage generator 300 (see FIG. 3) may receive the overcurrent control signal OCs from the current controller 500 and may decrease the voltage level of the first driving voltage ELVDD (see FIG. 3) or stop the output of the first driving voltage ELVDD in response to the overcurrent control signal OCs.

In FIG. 8A, a first graph T_EL_G1 represents the target current T_EL, a second graph S_EL_G2 represents the current signal S_EL, and a third graph R_EL_G3 represents a real emission current R_EL. In FIG. 8B, a fourth graph T_EL_G4 represents the target current T_EL, a fifth graph S_EL_G5 represents the current signal S_EL, a sixth graph R_EL_G6 represents the real emission current R_EL, and a seventh graph Ld_G7 represents the load Ld.

Referring to FIGS. 6, 7, and 8A, when a state where the current controller 500 communicates with the current detector 400 (see FIG. 3) is good, the current controller 500 may output the voltage control signal VCS based on the current signal S_EL and the target current T_EL. In detail, when the current signal S_EL is less than the target current T_EL, the current controller 500 may output the driving control signal VCS for increasing a voltage level of the first driving voltage ELVDD (see FIG. 3). Accordingly, the real emission current R_EL may be controlled to have a value that is close to the target current T_EL. When the display panel DP displays a video, the current signal S_EL sensed by the current detector 400 may be changed with time.

When the state where the current controller 500 communicates with the current detector 400 is bad, the current controller 500 may not receive the current signal S_EL transmitted from the current detector 400. In this case, the current controller 500 recognizes that a previous current signal thus previously received is a present current signal. Accordingly, the current signal S_EL recognized by the current controller 500 from the first time point t1 at which communication failure occurs may be fixed to the current signal S_EL immediately before the communication failure without being changed.

Accordingly, the current comparison unit 530 may compare a previous current signal and a present current signal. When the previous current signal is the same as the present current signal, the current comparison unit 530 may transmit the result signal Rs of the active state to the protection operating unit 540. The current comparison unit 530 may determine whether the current signal S_EL is uniformly maintained even after time goes by. When the current signal S_EL is maintained uniformly, the current comparison unit 530 may activate the result signal Rs.

When the present level of the load Ld is greater than the previous level of the load Ld, and the current level of the target current T_EL is not the same as the current level of the current signal S_EL, the protection operating unit 540 outputs the protection signal Ps at a second time point t2. Even though the current level of the target current T_EL has increased as the present level of the load Ld has increased to be greater than the previous level, the current level of the current signal S_EL may not be changed. In this case, when a difference in a current level between the target current T_EL and the current signal S_EL is greater than a predetermined reference level, the protection signal Ps may be output. For example, the protection operating unit 540 may compare the current level difference between the target current T_EL and the current signal S_EL to the reference level. When the current level difference exceeds the reference level, the protection operating unit 540 may output the protection signal Ps.

The protection signal Ps thus output may be provided to the voltage generator 300 (see FIG. 3). When the voltage generator 300 receives the protection signal Ps, the voltage generator 300 may perform a protection operation. As an example of the present disclosure, the voltage generator 300 may perform the protection operation of stopping the output of the first driving voltage ELVDD. When the first driving voltage ELVDD is not output from the voltage generator 300, the real emission current R_EL may decrease to a value of '0' at the second time point t2.

When the current controller 500 cannot communicate with the current detector 400 properly, and when a difference in a current level between the target current T_EL and the current signal S_EL is not greater than the predetermined reference level, the protection signal Ps may not be output, and the voltage control signal VCS may be provided to the voltage generator 300.

Referring to FIGS. 6, 7, and 8B, when the display panel DP (see FIG. 3) displays a still image (or a fixed pattern), the current signal S_EL sensed by the current detector 400 may be fixed without being changed during a predetermined time. When the display panel DP displays a still image (or a fixed pattern), there may be no change in the input image signal RGB (see FIG. 3), and thus the load Ld may also be fixed during a specific time.

Even though a communication failure occurs between the current detector 400 and the current controller 500 at the first time point t1 when the display panel DP displays a still image (or a fixed pattern), the protection operating unit 540 may not recognize the communication failure. Afterward, the fixed pattern may be changed at a third time point t3, and then the fixed pattern which has been changed may be maintained during a predetermined time. The load Ld may be changed at the third time point t3 at which the fixed pattern is changed. Accordingly, the current controller 500 may adjust the target current T_EL depending on the load Ld. For example, the target current T_EL may increase at the fourth time point t4.

However, even after the load Ld is changed, the current controller 500 may recognize the previously received current signal as a present current signal due to poor communication. Accordingly, a current level difference may occur between the target current T_EL and the current signal S_EL at a fourth time point t4. In other words, even when the present level of the load Ld is the same as the previous level of the load Ld, the protection operating unit 540 may output the protection signal Ps at the fourth time point t4 at which the current level of the target current T_EL is not the same as the current level of the current signal S_EL. For example, when the current level difference between the target current T_EL and the current signal S_EL exceeds a predetermined reference level, the protection operating unit 540 may output the protection signal Ps.

The voltage generator 300 stops outputting the first driving voltage ELVDD in response to the protection signal Ps. Accordingly, the real emission current R_EL may be reduced to a value of '0' at the fourth time point t4.

As such, even when the display panel DP (see FIG. 3) displays an image (e.g. a video or a still image), the real emission current R_EL may be blocked from increasing due to the malfunction of the current controller 500 caused by poor communication, thereby preventing the display panel DP from being damaged.

Figure 9:
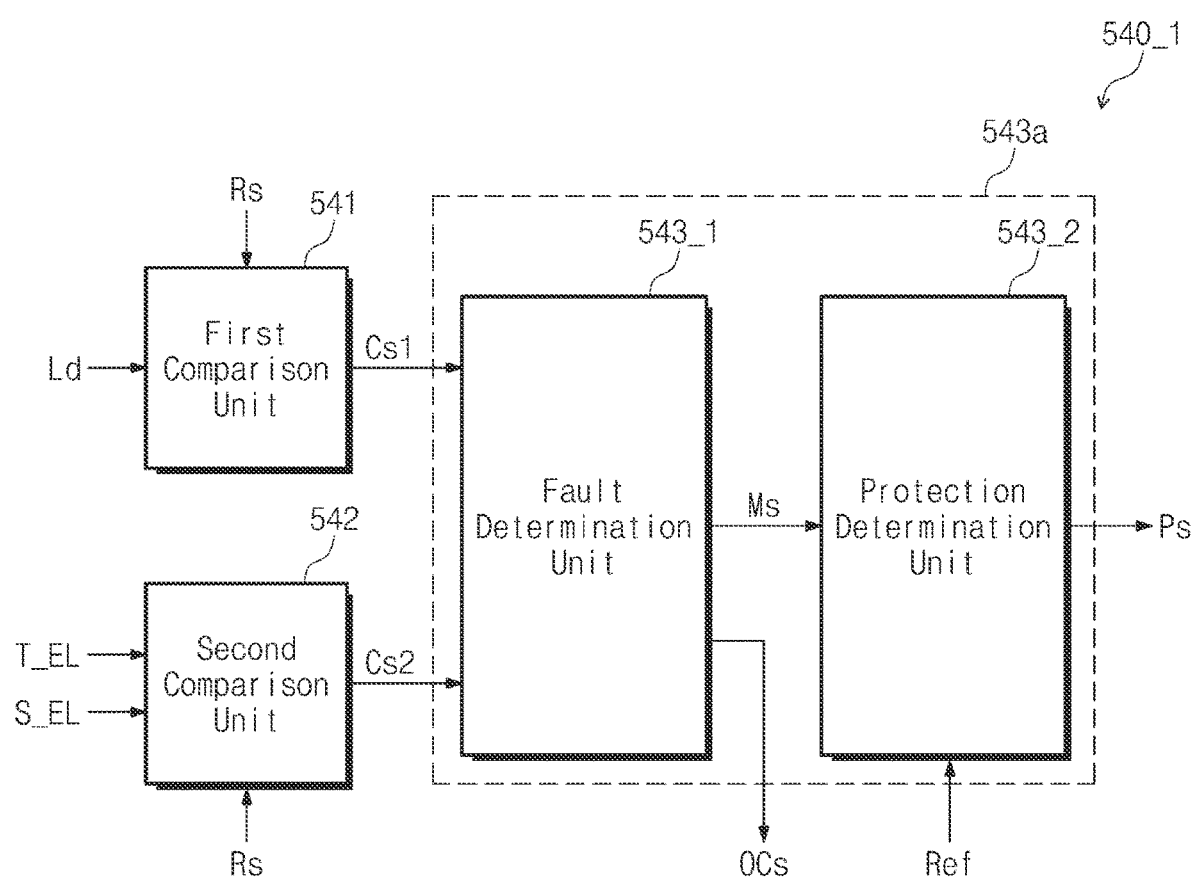
FIG. 9 is an internal block diagram of a protection operating unit according to an embodiment of the present disclosure.
Figure 10A:
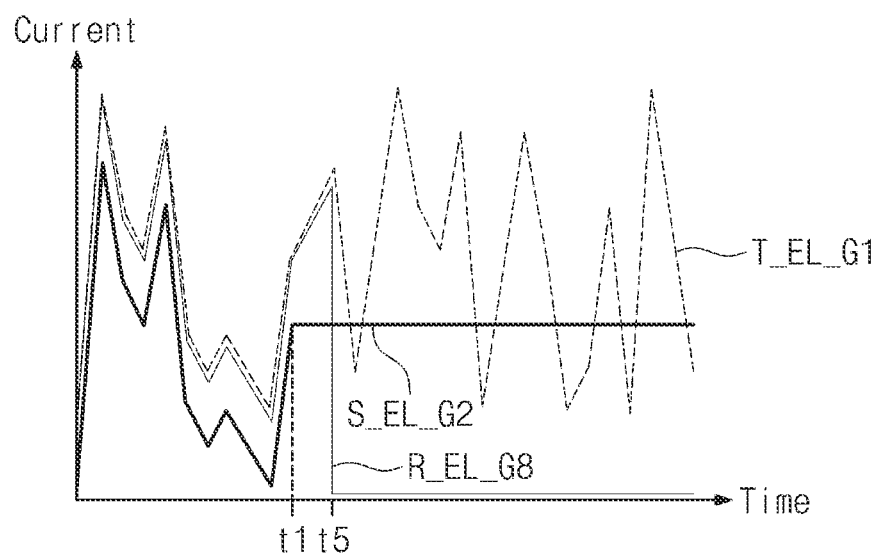
FIGS. 10A and 10B are diagrams for describing an operation of the protection operation unit shown in FIG. 9.
Figure 10B:
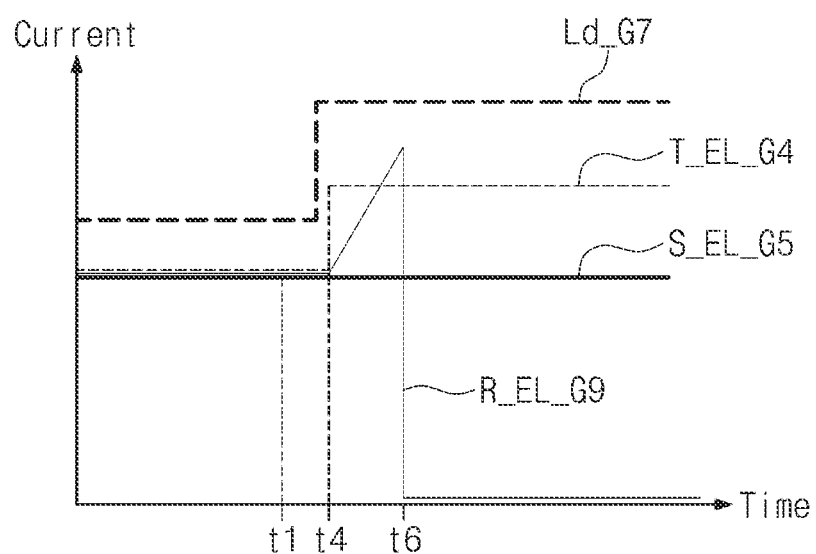

FIG. 9 is an internal block diagram of a protection operating unit according to an embodiment of the present disclosure. FIGS. 10A and 10B are diagrams for describing an operation of the protection operation unit shown in FIG. 9. The same reference numerals are given to the same components as those shown in FIG. 7 among the components shown in FIG. 9, and thus a detailed description thereof will be omitted to avoid redundancy.

Referring to FIG. 9, a protection operating unit 540_1 according to an embodiment of the present disclosure includes the first comparison unit 541, the second comparison unit 542, and a determination unit 543a. The determination unit 543a includes a fault determination unit 543_1 and a protection determination unit 543_2. The fault determination unit 543_1 receives the first comparison signal Cs1 from the first comparison unit 541 and receives the second comparison signal Cs2 from the second comparison unit 542. The fault determination unit 543_1 determines whether there is a fault based on the first and second comparison signals Cs1 and Cs2, and outputs a fault signal Ms depending on the determination result.

When the present level of the load Ld is greater than the previous level of the load Ld, and the current level of the target current T_EL is not the same as the current level of the current signal S_EL, the fault determination unit 543_1 outputs the fault signal Ms. Furthermore, when the current level of the target current T_EL is not the same as the current level of the current signal S_EL even when the present level of the load Ld is the same as the previous level of the load Ld, the fault determination unit 543_1 outputs the fault signal Ms. The fault signal Ms thus output may be provided to the protection determination unit 543_2.

When the present level of the load Ld is less than the previous level, and the current level of the target current T_EL is less than the current level of the current signal S_EL, the fault determination unit 543_1 may not output the protection signal Ps, but output an overcurrent control signal OCs. In this case, the voltage generator 300 (see FIG. 3) may receive the overcurrent control signal OCs from the current controller 500 and may decrease the voltage level of the first driving voltage ELVDD (see FIG. 3) or stop the output of the first driving voltage ELVDD in response to the overcurrent control signal OCs.

The protection determination unit 543_2 receives the fault signal Ms from the fault determination unit 543_1, accumulates the fault signal Ms, and generates an accumulation signal (e.g., the number of accumulations). The protection determination unit 543_2 determines whether to output (or activate) the protection signal Ps by comparing the accumulation signal to a predetermined reference signal Ref (e.g., a reference count). In detail, when the accumulation signal is greater than the reference signal Ref, the protection determination unit 543_2 may output the protection signal Ps. When the accumulation signal is less than or equal to the reference signal Ref, the protection determination unit 543_2 may not output the protection signal Ps.

The protection signal Ps output from the protection determination unit 543_2 may be provided to the voltage generator 300 (see FIG. 3). When the voltage generator 300 receives the protection signal Ps, the output of the first driving voltage ELVDD may be stopped. When the first driving voltage ELVDD is not output from the voltage generator 300, the operation of the display panel DP may be shut down.

In FIG. 10A, a first graph T_EL_G1 represents the target current T_EL, a second graph S_EL_G2 represents the current signal S_EL, and an eighth graph R_EL_G8 represents the real emission current R_EL. in FIG. 10B, a fourth graph T_EL_G4 represents the target current T_EL, a fifth graph S_EL_G5 represents the current signal S_EL, a ninth graph R_EL_G9 represents the real emission current R_EL, and a seventh graph Ld_G7 represents the load Ld.

Referring to FIGS. 6, 9, and 10A, the current signal S_EL recognized by the current controller 500 from the first time point t1 at which communication failure occurs may be fixed to the current signal S_EL which is immediately before the communication failure without being changed.

When the present level of the load Ld is greater than the previous level of the load Ld, and the current level of the target current T_EL is not the same as the current level of the current signal S_EL, the fault determination unit 543_1 outputs the fault signal Ms at the first time point t1.

The protection determination unit 543_2 accumulates the fault signal Ms provided from the fault determination unit 543_1, and then generates an accumulation signal. At the fifth time point t5 at which the accumulation signal is greater than the predetermined reference signal Ref, the protection determination unit 543_2 may output the protection signal Ps.

The voltage generator 300 may stop outputting the first driving voltage ELVDD in response to the protection signal Ps. Accordingly, the real emission current R_EL may be reduced to a value of '0' at the fifth time point t5 which is positioned after the second time point t2 illustrated in FIG. 8A.

Referring to FIGS. 6, 9, and 10B, when the display panel DP (see FIG. 3) displays a still image (or a fixed pattern), the current signal S_EL sensed by the current detector 400 may be fixed without being changed during a predetermined time. When the display panel DP displays a still image (or a fixed pattern), there may be no change in the input image signal RGB (see FIG. 3) so that the load Ld may be fixed during a specific time.

Even though a communication failure occurs between the current detector 400 and the current controller 500 at the first time point t1 when the display panel DP displays a still image (or a fixed pattern), the protection operating unit 540 may not recognize the communication failure. Afterward, the fixed pattern is changed, and thus the load Ld is changed. Accordingly, the changed state may be maintained during a specific time. However, even after the load Ld is changed, the current controller 500 recognizes the previously received signal to a present current signal.

After the load Ld is changed, even when it is maintained at a specific level (i.e., even when the present level of the load Ld is the same as the previous level of the load Ld), the fault determination unit 543_1 outputs the fault signal Ms from the fourth time point t4 at which the current level of the target current T_EL is not the same as the current level of the current signal S_EL.

The protection determination unit 543_2 accumulates the fault signal Ms provided from the fault determination unit 543_1 and then generates the accumulation signal. At a sixth time point t6 at which the accumulation signal is greater than the predetermined reference signal Ref, the protection determination unit 543_2 may output the protection signal Ps.

The voltage generator 300 stops outputting the first driving voltage ELVDD in response to the protection signal Ps. Accordingly, the real emission current R_EL may be reduced to a value of '0' at the sixth time point t6 which is positioned after the fourth time point t4.

As such, when the protection signal Ps is generated by accumulating the fault signal Ms, generating the accumulation signal, and comparing the accumulation signal with the reference signal Ref, it is possible to improve the accuracy of a protection operation. That is, a protection operation may be performed by finally recognizing a fault when the fault signal Ms is generated the reference number of times or more, without performing a protection operation at a time point at which the fault signal Ms first occurred, thereby improving the reliability of the protection operation.

Figure 11:
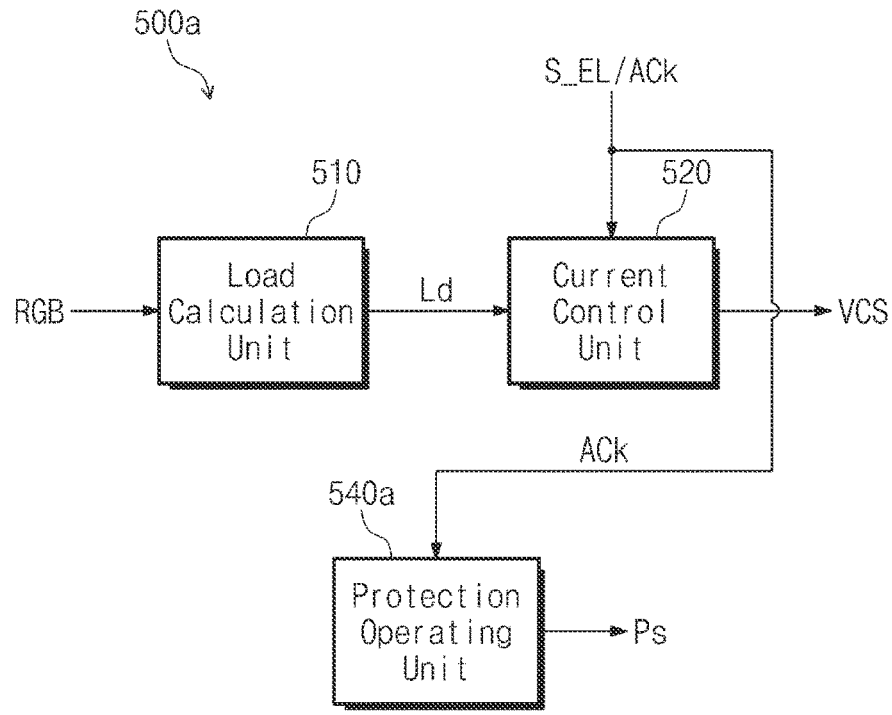
FIG. 11 is an internal block diagram of a current controller according to an embodiment of the present disclosure.
Figure 12:
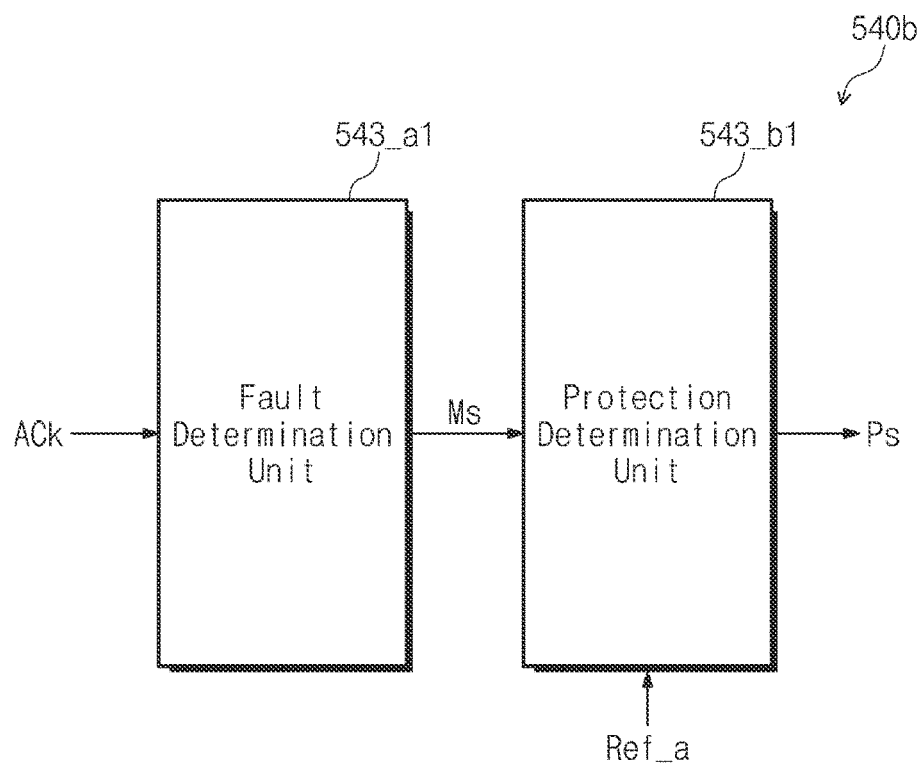
FIG. 12 is an internal block diagram of a protection operating unit according to an embodiment of the present disclosure.

FIG. 11 is an internal block diagram of a current controller according to an embodiment of the present disclosure. FIG. 12 is an internal block diagram of a protection operating unit according to an embodiment of the present disclosure. The same reference numerals are given to the same components as those shown in FIG. 6 among the components shown in FIG. 11, and thus a detailed description thereof will be omitted to avoid redundancy.

Referring to FIG. 11, a current controller 500a may receive the current signal S_EL by communicating with the current detector 400 (see FIG. 3). As an example of the present disclosure, the current controller 500a may receive the current signal S_EL from the current detector 400 in a manner of I2C interface. The current detector 400 may terminate the transmission of the current signal S_EL and may further transmit a response signal ACk to the current controller 500a.

The current controller 500a may include the load calculation unit 510, the current controller 520, and a protection operating unit 540a. The configuration of the load calculation unit 510 and the current controller 520 is the same as the configuration of the load calculation unit 510 and the current controller 520 shown in FIG. 6, and thus a detailed description thereof will be omitted to avoid redundancy.

The protection operating unit 540a determines whether to output the protection signal Ps based on whether the response signal ACk transmitted by the current detector 400 is received. When there is no communication failure between the current controller 500a and the current detector 400, the protection operating unit 540a may normally receive the response signal ACk. However, when the communication failure occurs between the current controller 500a and the current detector 400, the protection operating unit 540a might not normally receive the response signal ACk.

When the response signal ACk is not received from the current detector 400, the protection operating unit 540a may recognize the communication failure and may output (or generate) the protection signal Ps. When the response signal ACk is received from the current detector 400, the protection operating unit 540a may recognize that communication is good, and may not output (or generate) the protection signal Ps.

The protection signal Ps output from the protection operating unit 540a may be provided to the voltage generator 300 (see FIG. 3). When the voltage generator 300 receives the protection signal Ps, the output of the first driving voltage ELVDD may be stopped. When the first driving voltage ELVDD is not output from the voltage generator 300, the operation of the display panel DP may be shut down.

Alternatively, referring to FIG. 12, a protection operating unit 540b may include a fault determination unit 543_a1 and a protection determination unit 543_b1.

When the response signal ACk is not received, the fault determination unit 543_a1 recognizes the communication failure and outputs the fault signal Ms. Furthermore, when the response signal ACk is received, the fault determination unit 543_a1 recognizes that communication is good and does not output the fault signal Ms.

The protection determination unit 543_b1 receives the fault signal Ms from the fault determination unit 543_a1, accumulates the fault signal Ms, and generates an accumulation signal. The protection determination unit 543_b1 determines whether to output (or activate) the protection signal Ps, by comparing the accumulation signal with a predetermined reference signal Ref_a. In detail, when the accumulation signal is greater than the reference signal Ref_a, the protection determination unit 543_b1 may output the protection signal Ps. When the accumulation signal is less than or equal to the reference signal Ref_a, the protection determination unit 543_b1 may not output the protection signal Ps.

The protection signal Ps output from the protection determination unit 543_b1 may be provided to the voltage generator 300 (see FIG. 3). When the voltage generator 300 receives the protection signal Ps, the output of the first driving voltage ELVDD may be stopped. When the first driving voltage ELVDD is not output from the voltage generator 300, the operation of the display panel DP may be shut down.

As such, when the protection signal Ps is generated by accumulating the fault signal Ms, generating the accumulation signal, and comparing the accumulation signal with the reference signal Ref_a, it is possible to improve the accuracy of a protection operation. That is, a protection operation may be performed by finally recognizing a fault when the response signal ACk is not received the reference number of times or more, without immediately performing a protection operation at a time point at which the response signal ACk is not received first, thereby improving the reliability of the protection operation.

Although an embodiment of the present disclosure has been described for illustrative purposes, those skilled in the art will appreciate that various modifications, and substitutions are possible, without departing from the scope and spirit of the present disclosure as disclosed in the accompanying claims. Accordingly, the technical scope of the present disclosure is not limited to the detailed description of this specification, but should be defined by the claims.

According to an embodiment of the present disclosure, even when a display panel displays an image (e.g. a video or a still image), a real emission current may be blocked from increasing due to the malfunction of a current controller caused by poor communication, thereby preventing damages to a display panel.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
    a display panel including a pixel and receiving a driving voltage;
    a voltage generator connected to a first voltage line, the first voltage line transmitting the driving voltage generated from the voltage generator to the pixel;
    a current detector connected to the first voltage line, the current detector detecting a driving current of the display panel through the first voltage line during a present detection frame, and outputting a current signal corresponding to the driving current of the display panel; and
    a current controller connected to the current detector, the current controller outputting a voltage control signal and a protection signal to the voltage generator, and receiving the current signal corresponding to the driving current of the display panel from the current detector,
    wherein the voltage generator receives the voltage control signal and the protection signal from the current controller to determine a voltage level of the driving voltage based on the voltage control signal, and to perform a protection operation in response to the protection signal,
    wherein the current controller calculates a load based on an input image data, sets a target current corresponding to the load, and outputting the voltage control signal by comparing a current level of the target current to a current level of the current signal,
    wherein the current controller includes:
    a current comparison unit connected to the current detector to receive the current signal, the current comparison unit generating a result signal by comparing a present current level of the current signal to a previous current level of a previous current signal detected during a previous detection frame; and
    a protection operating unit connected to the current comparison unit, the protection operating unit receiving the result signal generated from the current comparison unit, and outputting the protection signal based on a change in the load and a difference between the target current and the current signal, and
    wherein the protection operating unit is activated in response to the result signal of an active state to output the protection signal.

2. The display device of claim 1, wherein the current comparison unit outputs the result signal of an inactive state when the present current level of the current signal is different from the previous current level, and outputs the result signal of the active state when the present current level of the current signal is identical to the previous current level.

3. The display device of claim 2, wherein the protection operating unit includes:
    a first comparison unit connected to the current comparison unit to receive the result signal, the first comparison unit being activated in response to the result signal of the active state and outputting a first comparison signal by comparing a present level of the load to a previous level of the load;

a second comparison unit connected to the current comparison unit to receive the result signal, the second comparison unit being activated in response to the result signal of the active state and outputting a second comparison signal by comparing the current level of the target current to the current level of the current signal; and a determination unit connected to the first comparison unit and the second comparison unit, the determination unit determining whether to activate the protection signal based on the first comparison signal and the second comparison signal.

4. The display device of claim 3, wherein, when the present level of the load is greater than the previous level, and the current level of the target current is not identical to the current level of the current signal, the determination unit outputs the protection signal, and wherein, when the current level of the target current is not identical to the current level of the current signal even when the present level of the load is identical to the previous level, the determination unit outputs the protection signal.

5. The display device of claim 4, wherein, when the present level of the load is less than the previous level and the current level of the target current is less than the current level of the current signal, the determination unit does not output the protection signal, but outputs an overcurrent control signal.

6. The display device of claim 5, wherein the voltage generator receives the overcurrent control signal or the protection signal from the current controller, decreases the voltage level of the driving voltage or stops an output of the driving voltage in response to the overcurrent control signal, and stops the output of the driving voltage in response to the protection signal.

7. The display device of claim 3, wherein the determination unit includes:

a fault determination unit configured to determine whether there is a fault based on the first comparison signal and the second comparison signal and to output a fault signal depending on the determination result; and a protection determination unit configured to:
receive the fault signal from the fault determination unit, generate an accumulation signal by accumulating the fault signal, and
determine whether to output the protection signal by comparing the accumulation signal with a predetermined reference signal.

8. The display device of claim 7, wherein, when the accumulation signal is greater than the reference signal, the protection determination unit outputs the protection signal, and wherein, when the accumulation signal is less than or equal to the reference signal, the protection determination unit does not output the protection signal.

9. The display device of claim 7, wherein, when the present level of the load is greater than the previous level and the current level of the target current is not identical to the current level of the current signal, the fault determination unit outputs the fault signal, and wherein, when the current level of the target current is not identical to the current level of the current signal even when the present level of the load is identical to the previous level, the fault determination unit outputs the fault signal.

10. The display device of claim 9, wherein, when the present level of the load is less than the previous level and the current level of the target current is less than the current level of the current signal, the fault determination unit does not output the fault signal but outputs an overcurrent control signal.

11. The display device of claim 10, wherein the voltage generator receives the overcurrent control signal or the protection signal from the current controller, decreases the voltage level of the driving voltage or stops an output of the driving voltage in response to the overcurrent control signal, and stops the output of the driving voltage in response to the protection signal.

12. The display device of claim 1, wherein the current controller further includes:

a load calculation unit configured to calculate the load based on the input image data; and a current control unit configured to:
set the target current corresponding to the load; and
output the voltage control signal by comparing the current level of the target current with the current level of the current signal.

13. The display device of claim 1, wherein the pixel includes:

a light emitting element; and a transistor disposed between the first voltage line and the light emitting element and including a gate electrode which is controlled by a data signal.

14. An electronic device comprising:

a display device; and an electronic module coupled to the display device, the display device comprising:

a display panel including a pixel and receiving a driving voltage;

a voltage generator connected to a first voltage line, the first voltage line transmitting the driving voltage generated from the voltage generator to the pixel;

a current detector connected to the first voltage line, the current detector detecting a driving current of the display panel through the first voltage line during a present detection frame, and outputting a current signal corresponding to the driving current of the display panel; and a current controller connected to the current detector, the current controller outputting a voltage control signal and a protection signal to the voltage generator, and receiving the current signal corresponding to the driving current of the display panel from the current detector, wherein the voltage generator receives the voltage control signal and the protection signal from the current controller to determine a voltage level of the driving voltage based on the voltage control signal, and to perform a protection operation in response to the protection signal, the current controller calculates a load based on an input image data, sets a target current corresponding to the load, and outputting the voltage control signal by comparing a current level of the target current to a current level of the current signal, wherein the current controller includes:

a current comparison unit connected to the current detector to receive the current signal, the current comparison unit generating a result signal by comparing a present current level of the current signal to a previous current level of a previous current signal detected during a previous detection frame; and a protection operating unit connected to the current comparison unit, the protection operating unit receiving the result signal generated from the current comparison unit, and outputting the protection signal based on a change in the load and a difference between the target current and the current signal, wherein the protection operating unit is activated in response to the result signal of an active state to output the protection signal.

* * * * *